(12) United States Patent
Takeno et al.

(10) Patent No.: US 6,277,715 B1
(45) Date of Patent: Aug. 21, 2001

(54) PRODUCTION METHOD FOR SILICON EPITAXIAL WAFER

(75) Inventors: Hiroshi Takeno; Yoshinori Hayamizu, both of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/321,567

(22) Filed: May 28, 1999

(30) Foreign Application Priority Data

Jun. 11, 1998 (JP) .................................................. 10-163524

(51) Int. Cl.$^7$ ..................................................... H01L 21/20

(52) U.S. Cl. ............................................................ 438/492

(58) Field of Search ..................................... 438/502, 503, 438/770, 787, 976, 492, 507, 509; 148/33, 33.3; 117/3, 94

(56) References Cited

FOREIGN PATENT DOCUMENTS

| 08097220 | * | 4/1996 | (JP) . |
| 08250506 | * | 4/1996 | (JP) . |
| 08 097220 | | 4/1996 | (JP) . |
| 08 250506 | | 9/1996 | (JP) . |
| WO 98 25299 | | 6/1998 | (WO) . |

OTHER PUBLICATIONS

Wijaranakula et al., "Influence of the pre–epitaxial annealing . . . ", J. Appl. Phys. 65 (5) pp. 2078–2083, Mar. 1989.*

Wijaranakula, W., et al., "Influence of the Preepitaxial Annealing and Polycrystalline Silicon Deposition Processes on Oxygen Precipitation and Internal Gettering in N/N$^+$ (100) Epitaxial Silicon Wafers," Journal of Applied Physics, Mar. 1, 1989, vol. 65, No. 5, pp. 2078–2083 XP000568094.

* cited by examiner

Primary Examiner—Keith Christianson
(74) Attorney, Agent, or Firm—Snider & Associates; Ronald R. Snider

(57) ABSTRACT

Provided is a production method for a silicon epitaxial wafer having an internal gettering (IG) capability at a level equal to that of a CZ silicon mirror-finished wafer. In the production method for a silicon epitaxial wafer in which silicon single crystal is epitaxially grown on a silicon wafer; a heat treatment of the silicon wafer is performed at a temperature within ±50° C. of a holding temperature for the first stage heat treatment which is to be firstly effected as a heat treatment in the device fabrication process after the epitaxial growth process for a time period equal to or more than a time period in which a precipitate nucleus from interstitial oxygen in the silicon wafer can grow to a size which survives through the epitaxial growth process, prior to the epitaxial growth process, and thereafter, the epitaxial growth is effected; or a heat treatment of the silicon wafer is performed being kept at a temperature within ±50° C. of a holding temperature for the first stage heat treatment which is to be at first effected as a heat treatment in the device fabrication process after the epitaxial growth process for a time period equal to or more than a time period in which a precipitate nucleus from interstitial oxygen in the silicon wafer can grow to a size a nucleus of which survives through the epitaxial growth process, in the course of raising temperature after start of the epitaxial growth process, and thereafter, a temperature is raised to an epitaxial growth temperature to perform the epitaxial growth.

16 Claims, 2 Drawing Sheets first stage heat treatment temperature (°C)

PRODUCTION METHOD FOR SILICON EPITAXIAL WAFER

RELATED APPLICATION

This application claims the priority of Japanese Patent Application No. 10-163524 filed on Jun. 11, 1998, which is incorporated herein by reference.

BACKGROUND OF THE INVENTION

This invention relates to a production method for a silicon epitaxial wafer and, more particularly, to a production method for a silicon epitaxial wafer having an internal gettering capability at a level equal to that of a Czochralski (hereinafter abbreviated as CZ) silicon mirror-finished wafer.

Heretofore, as a semiconductor wafer on which a semiconductor device such as IC, LSI or the like is fabricated, a CZ silicon mirror-finished wafer has generally been used, which is obtained by a procedure in which a wafer is cut from a silicon single crystal which has been grown by being pulled from a silicon melt by means of a CZ method and the wafer is then subjected to mirror polishing on its front surface. The silicon single crystal grown by the CZ method is supersaturated with interstitial oxygen and the interstitial oxygen is precipitated in the form of silicon oxide as the silicon single crystal is cooled down to room temperature after solidification subsequent to a crystal pulling process and due to the precipitation, a number of oxide precipitate nuclei are formed. When an IC or the like is fabricated using a CZ silicon mirror-finished wafer obtained from a silicon single crystal in which a number of the oxide precipitate nuclei are formed, the oxide precipitate nuclei grow to progress oxygen precipitation with the result that a number of microdefects induced by the oxide precipitate nuclei generate in the bulk of the wafer in a heat treatment of the device fabrication process.

A microdefect induced by an oxide precipitate nucleus preferably works as a gettering site at which heavy metal impurities and the like are captured due to the so-called internal gettering (hereinafter abbreviated as IG) effect when the microdefect exists in the interior region (bulk region). It has known, however, that if microdefects exist in the active region in the vicinity of a wafer surface where semiconductor devices are fabricated, it becomes a factor detrimental to operation of the devices which in turn entails degradation in device characteristics and exerts an adverse influence directly on the device yield.

In recent years, a demand for a silicon epitaxial wafer has been increased, which is produced by depositing silicon single crystal on a CZ silicon mirror-finished wafer in vapor phase growth (epitaxial growth), as substitution for a CZ silicon mirror-finished wafer, in order to make an active region in the vicinity of a wafer surface where semiconductor devices are fabricated defect free.

There has, however, been a problem that a silicon epitaxial wafer has a low IG capability compared with a CZ silicon mirror-finished wafer. In other words, in the case of the CZ silicon mirror-finished wafer, since a number of oxide precipitate nuclei are formed in a CZ silicon single crystal while the crystal is cooled down to room temperature after solidification in a crystal pulling process, the oxygen precipitation further progresses in a semiconductor device fabrication process through growth of the precipitate nuclei, whereas, in the case of the silicon epitaxial wafer, since an epitaxial growth process is effected at a temperature as high as the order in the range of 1100 to 1150° C., oxide precipitate nuclei formed in the silicon single crystal pulling process are transited to a solution state during the epitaxial growth process, which suppresses oxygen from precipitation in the semiconductor fabrication process compared with the case of the CZ mirror-finished wafer. Hence, a silicon epitaxial wafer has the IG capability at a low level compared with a CZ silicon mirror-finished wafer.

In order to solve this problem, external gettering (hereinafter abbreviated as EG) methods have heretofore been employed, in which gettering sites are formed on the rear surface of a silicon epitaxial wafer. For example, as the EG methods, there are named: a sandblast (hereinafter abbreviated as SB) method in which defects are externally formed on the rear surface of a wafer by intention, a PBS method in which a polysilicon film is deposited on the rear surface of a wafer and the like.

In such conventional methods, a distance between a active region where semiconductor devices are fabricated (on the front surface) and a gettering site (on the rear surface) is long, which problematically causes time for impurities to be captured to be longer. Such circumstances come to be more conspicuous when a semiconductor device fabrication process is performed at a lower temperature, since a time required for an impurity to diffuse up to the rear surface of a wafer is longer. Therefore, an IG method is desirably selected to be in use, in which method a distance between an active region (on the front surface) where semiconductor devices are fabricated and a gettering site (in the bulk) is short.

SUMMARY OF THE INVENTION

This invention has been made taking such a problem into consideration and it is accordingly an object of the invention to provide a production method for a silicon epitaxial wafer having an IG capability at a level equal to that of a CZ silicon mirror-finished wafer.

An aspect of the invention there is provided a production method for a silicon epitaxial wafer which is obtained by epitaxially growing silicon single crystal on a silicon wafer and subsequently put into a device fabrication process including a plurality of heat treatments, wherein a heat treatment of the silicon wafer is performed at a temperature within ±50° C. of a holding temperature for the first stage heat treatment which is to be firstly effected as a heat treatment in the device fabrication process after the epitaxial growth process for a time period equal to or more than a time period in which a precipitate nucleus from interstitial oxygen in the silicon wafer can grow to a size a nucleus of which survives through the epitaxial growth process, prior to the epitaxial growth process, and thereafter, the epitaxial growth is effected. Preferably, the first stage heat treatment is a heat treatment for forming an oxide film. The time for the heat treatment prior to the epitaxial growth process is one hour or more. The heat treatment prior to the epitaxial growth process is effected at a temperature in the range of 700 to 1000° C.

Another aspect of the invention there is provided a production method for a silicon epitaxial wafer which is obtained by epitaxially growing silicon single crystal on a silicon wafer and subsequently put into a device fabrication process including a plurality of heat treatments, wherein a heat treatment of the silicon wafer is performed being kept at a temperature within ±50° C. of a holding temperature for the first stage heat treatment which is to be firstly effected as a heat treatment in the device fabrication process after the epitaxial growth process for a time period equal to or more than a time period in which a precipitate nucleus from interstitial oxygen in the silicon wafer can grow to a size a nucleus of which survives through the epitaxial growth process, in the course of raising temperature after start of the epitaxial growth process, and thereafter, a temperature is raised to an epitaxial growth temperature to perform the epitaxial growth. Preferably, the first stage heat treatment is a heat treatment for forming an oxide film. The time for the heat treatment at a holding temperature in the course of raising temperature after start of the epitaxial growth process is one hour or more. The heat treatment in the course of raising temperature after start of the epitaxial growth process is effected at a holding temperature in the range of 700 to 1000° C.

In the first aspect of the invention, the silicon wafer is subjected to a heat treatment at a temperature within ±50° C. of a holding temperature for the first stage heat treatment which is to be firstly effected as a heat treatment in the device fabrication process after the epitaxial growth process for a time period equal to or more than a time period in which a precipitate nucleus from interstitial oxygen in the silicon wafer can grow to a size a nucleus of which survives through the epitaxial growth process, prior to the epitaxial growth process. This is to control oxygen precipitation taking advantage of a fact that how much oxide precipitate nuclei in a wafer which have been formed according to the thermal history in the pulling of a single crystal ingot grow to progress oxygen precipitation in the device fabrication process is dependent on the first stage heat treatment temperature in the device fabrication process. That is, a behavior in oxygen precipitation in the first stage heat treatment which is firstly effected as a heat treatment in the semiconductor device fabrication process following the epitaxial growth process is conjectured in advance and an equivalent heat treatment of the first stage heat treatment is effected prior to the epitaxial growth process in advance. By giving a heat treatment on a silicon wafer prior to the epitaxial growth process in this way, oxide precipitate nuclei are remained without assuming a solution state during an epitaxial growth process even when the epitaxial growth is conducted after the heat treatment, so that oxygen precipitation in the semiconductor device fabrication process is not suppressed. Hence, a silicon epitaxial water produced by a method of the invention has an IG capability at a level equal to that of a CZ silicon mirror-finished wafer.

In the second aspect of the invention, a heat treatment of the silicon wafer is performed being kept at a temperature within ±50° C. of a holding temperature for the first stage heat treatment which is to be firstly effected as a heat treatment in the device fabrication process after the epitaxial growth process for a time period equal to or more than a time period in which a precipitate nucleus from interstitial oxygen in the silicon wafer can grow to a size a nucleus of which survives through the epitaxial growth process, in the course of raising temperature after start of the epitaxial growth process, and thereby, oxide precipitate nuclei are remained without assuming a solution state during an epitaxial growth process even when the epitaxial growth is conducted while temperature is raised up to the epitaxial growth temperature after the heat treatment as described above, so that oxygen precipitation in the semiconductor device fabrication process is not suppressed. Hence, a silicon epitaxial wafer produced by a method of the invention has an IG capability at a level equal to that of a CZ silicon mirror-finished wafer.

As the first stage heat treatment which is firstly effected as a heat treatment in the semiconductor device fabrication process, an oxide film forming heat treatment is generally named. The time period in which a precipitate nucleus from interstitial oxygen in a silicon wafer can grow to a size a nucleus of which survives through the epitaxial growth process is preferably one hour or more. In addition, a holding temperature in the heat treatment prior to the epitaxial growth or in the course of raising temperature after start of the epitaxial growth process is preferably in the range of 700 to 1000° C.

According to the invention, a silicon epitaxial wafer having an IG capability at a level equal to that of a CZ silicon mirror-finished wafer can be produced. Therefore, even when a CZ silicon mirror-finished wafer used in a device fabrication process is changed to a silicon epitaxial wafer, there arises no anxiety about reduction in the IG capability, which enables the silicon epitaxial wafer to be used at ease.

DETAILED DESCRIPTION OF THE INVENTION

Figure 1:
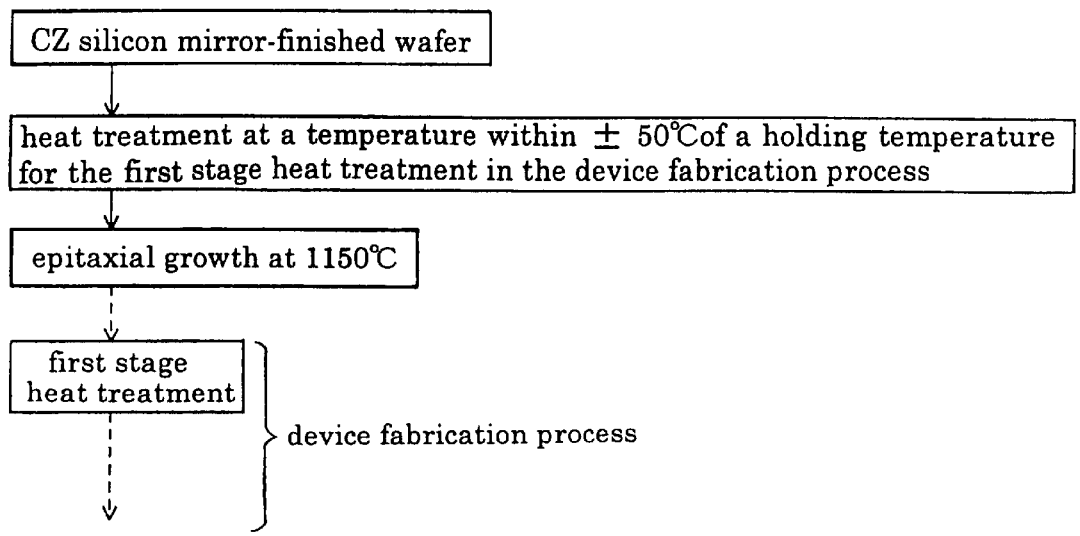
FIG. 1 is a flow chart showing fabrication steps in an example embodying the invention.
Figure 2:
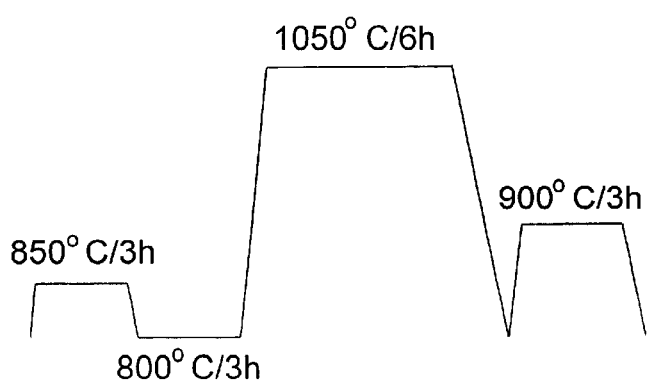
FIG. 2 is a graph showing an example of a heat process.

Embodiments of the invention will be described with reference to the accompanying drawings. FIG. 1 shows an example embodying the invention. A CZ silicon mirror-finished wafer was subjected to a heat treatment at a temperature within ±50° C. of a holding temperature for the first stage heat treatment in the device fabrication process, for example, for 3 hr and after that, silicon single crystal is deposited in epitaxial growth, for example, at 1150° C. to produce a silicon epitaxial wafer. Thereafter, the silicon epitaxial wafer is put into the semiconductor device fabrication process and thereby, semiconductor devices are formed in the vicinity of the surface of the wafer. In the semiconductor device fabrication process, for example, a heat process shown in FIG. 2 is adopted.

Figure 3:
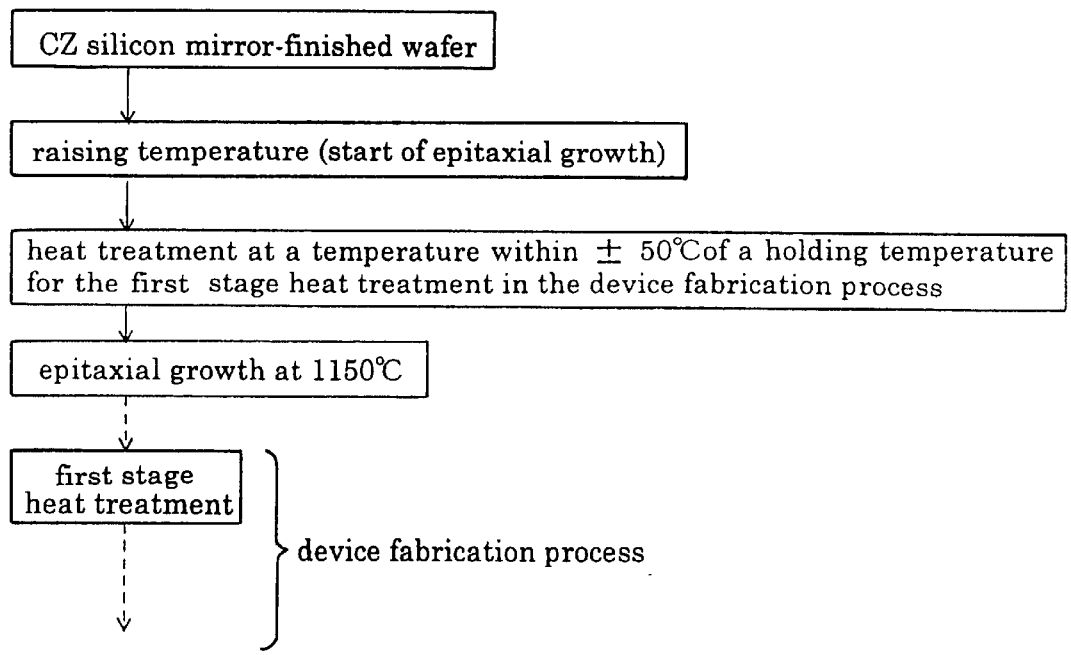
FIG. 3 is a flow chart showing fabrication steps in a second example embodying the invention.

FIG. 3 shows a second example embodying the invention. In order to epitaxially grow silicon single crystal on a CZ silicon mirror-finished wafer, raising temperature of the wafer gets started and the temperature is raised to a temperature within ±50° C. of a holding temperature for the first stage heat treatment in the device fabrication process. The wafer is kept at thus raised temperature, for example, for 3 hr, thereafter, the wafer is further heated up to an epitaxial growth temperature, for example, of 1150° C. and silicon single crystal is deposited on the wafer in epitaxial growth to produce a silicon epitaxial wafer Then, by putting the silicon epitaxial wafer into the semiconductor device fabrication process, semiconductor devices are formed in the vicinity of the surface of the wafer.

EXAMPLE 1

A CZ silicon mirror-finished wafer of 16 ppma in the initial interstitial oxygen concentration was subjected to a heat treatment at 850° C. for 3 hr and after that, silicon single crystal was deposited in epitaxial growth at 1150 ° C. to a thickness of about 5 μm to produce a silicon epitaxial wafer. Thereafter, the silicon epitaxial wafer was subjected to a heat process which simulates a device fabrication process as shown in FIG. 2 and thereafter, a bulk defect density was measured on the silicon epitaxial wafer by infrared laser scattering tomography. Infrared laser scattering tomography is a method of sensing a defect in which an infrared laser beam is projected into a crystal and the scattering light caused by defects in the crystal is sensed. As a result, the bulk defect density was measured at $1.5 \times 10^9/cm^3$.

EXAMPLE 2

A CZ silicon mirror-finished wafer same as that of the example 1 was used and the wafer was heated for epitaxial growth to 850° C. and kept at the temperature for 3 hr. Thereafter, a temperature of the wafer was further raised to 1150° C. and silicon single crystal was deposited by means of epitaxial growth to a thickness of 5 $\mu$m to produce a silicon epitaxial wafer. Then, the silicon epitaxial wafer was subjected to the heat process as shown in FIG. 2 and a bulk defect density was measured by infrared laser scattering tomography. As a result, the bulk defect density was $3 \times 10^9/cm^3$.

Comparative Example 1

A CZ silicon mirror-finished wafer same as that of the example 1 was used and the wafer was subjected to the heat process as shown in FIG. 2. Thereafter, a bulk defect density of the wafer was measured by infrared laser scattering tomography. As a result, the bulk defect density was $1.8 \times 10^9/cm^3$.

Comparative Example 2

A CZ silicon mirror-finished wafer same as that of the example 1 was used and silicon single crystal was deposited on the wafer by means of epitaxial growth at 1150° C., without a preheat treatment applied to the wafer, to produce a silicon epitaxial wafer. Thereafter, the wafer was subjected to the heat process shown in FIG. 2 and a bulk defect density was then measured by infrared laser scattering tomography. As a result, the bulk defect density was $4 \times 10^6/cm^3$ (lower limit of detection) or less.

Other Examples and Comparative Examples

Figure 4:
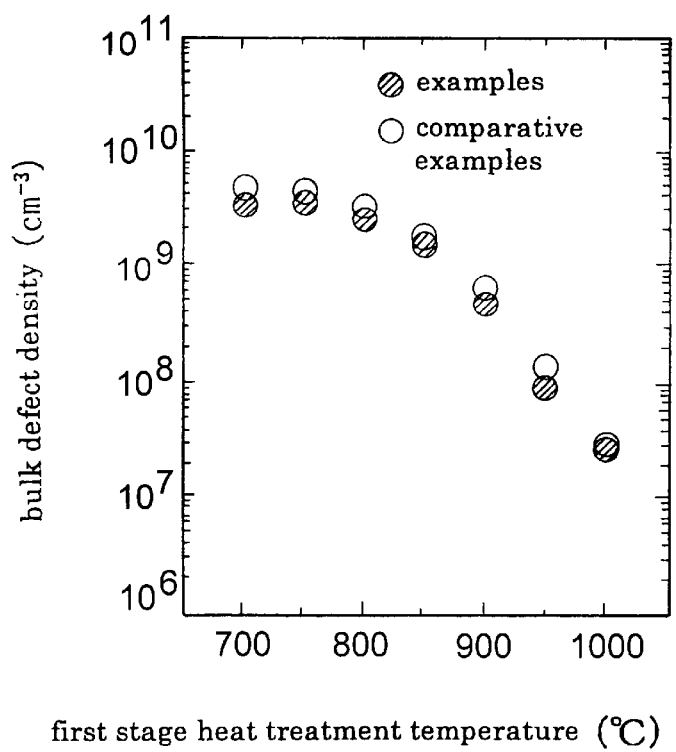
FIG. 4 is a graph showing a relation of heat treatment temperature and bulk defect density.

Heat treatments, which correspond to the first stage heat treatment of the heat process, at different temperatures were respectively applied to CZ silicon mirror-finished wafers and thereafter, the wafers were subjected to epitaxial growth to produce silicon epitaxial wafers. In a detailed manner, a plurality of CZ silicon mirror wafers were divided into 7 groups and as the preheat treatments for the epitaxial growth, heat treatments were respectively applied to the groups while different temperatures of heat treatments corresponding to the first stage heat treatment as shown in FIG. 2: 700° C., 750° C., 800° C., 850° C., 900° C., 950° C. and 1000° C. are assigned to the groups. Heat treatment time periods for the groups were in the range of 1 to 8 hr. Thereafter, the CZ silicon mirror-finished wafers which had respectively received the preheat treatments as described above were subjected to epitaxial growth at 1150° C. to the thickness of about 5 $\mu$m thereon to produce silicon epitaxial wafers. The 7 groups of silicon epitaxial wafers were respectively subjected to the same heat processes as the heat process shown in FIG. 2 except the respective first stage heat treatments which were assigned with the temperatures of the preheat treatments. Thus obtained wafers were handled as wafers of the examples embodying the invention. On the other hand, CZ silicon mirror-finished wafers same as the above described examples which had been subjected to neither the preheat treatments or the epitaxial growth were divided to 7 groups and subjected to the same heat treatments as the heat process shown in FIG. 2 like the examples, wherein the first stage heat treatments were respectively assigned with the corresponding temperatures of the examples. Thus obtained were handled as wafers of the comparative examples. Bulk defect densities were measured on all the wafers from the examples and comparative examples by infrared laser scattering tomography. Results are shown in FIG. 4. The wafers of the examples were found to show bulk defect densities of almost the same order as that of the comparative examples in any individual heat process condition. In other words, it has been confirmed that an IG capability of a CZ silicon mirror-finished wafer is not reduced even after epitaxial growth as far as a temperature of a preheat treatment which is effected prior to the epitaxial growth is set in the range of 700 to 1000° C.

What is claimed is:

1. A production method for a semiconductor device comprising the steps of:

prior to an epitaxial growth process, performing a heat treatment at a temperature within ±50° C. of a holding temperature for a first stage heat treatment which is to be firstly effected as a heat treatment in a device fabrication process after the epitaxial growth process for a time period equal to or more than a time period in which a precipitate nucleus of interstitial oxygen in a silicon wafer can grow to a precipitate size which survives through the epitaxial growth process;

forming silicon single crystal on the silicon wafer in the epitaxial growth process after the heat treatment to produce a silicon epitaxial wafer; and putting the silicon epitaxial wafer into the semiconductor device fabrication process in which a plurality of heat treatments including the first stage heat treatment is performed.

2. A production method for a semiconductor device according to claim 1, wherein the first stage heat treatment is a heat treatment for forming an oxide film.

3. A production method for a semiconductor device according to claim 1, wherein the time for the heat treatment prior to the epitaxial growth process is one hour or more.

4. A production method for a semiconductor device according to claim 2, wherein the time for the heat treatment prior to the epitaxial growth process is one hour or more.

5. A production method for a semiconductor device according to claim 1, wherein the heat treatment prior to the epitaxial growth process is effected at a temperature in the range of 700 to 1000° C.

6. A production method for a semiconductor device according to claim 2, wherein the heat treatment prior to the epitaxial growth process is effected at a temperature in the range of 700 to 1000° C.

7. A production method for a semiconductor device according to claim 3, wherein the heat treatment prior to the epitaxial growth process is effected at a temperature in the range of 700 to 1000° C.

8. A production method for a semiconductor device according to claim 4, wherein the heat treatment prior to the epitaxial growth process is effected at a temperature in the range of 700 to 1000° C.

9. A production method for a semiconductor device comprising the steps of:

prior to an epitaxial growth, performing a heat treatment in the course of raising temperature during start of an epitaxial growth process, the heat treatment being one at a temperature within ±50° C. of a holding temperature for a first stage heat treatment which is to be firstly effected as a heat treatment in a device fabrication process after the epitaxial growth process for a time period equal to or more than a time period in which a precipitate nucleus of interstitial oxygen in a silicon wafer can grow to a precipitate size which survives through the epitaxial growth process;

forming silicon single crystal on the silicon wafer in the epitaxial growth process after the heat treatment by raising temperature to an epitaxial growth temperature to produce a silicon epitaxial wafer; and putting the silicon epitaxial wafer into the semiconductor device fabrication process in which a plurality of heat treatments including the first stage heat treatment is performed.

10. A production method for a semiconductor device according to claim 9, wherein the first stage heat treatment is a heat treatment for forming an oxide film.

11. A production method for a semiconductor device according to claim 9, wherein the time for the heat treatment at a holding temperature in the course of raising temperature during start of the epitaxial growth process is one hour or more.

12. A production method for a semiconductor device according to claim 10, wherein the time for the heat treatment at a holding temperature in the course of raising temperature during start of the epitaxial growth process is one hour or more.

13. A production method for a semiconductor device according to claim 9, wherein the heat treatment in the course of raising temperature during start of the epitaxial growth process is effected at a holding temperature in the range of 700 to 1000° C.

14. A production method for a semiconductor device according to claim 10, wherein the heat treatment in the course of raising temperature during start of the epitaxial growth process is effected at a holding temperature in the range of 700 to 1000° C.

15. A production method for a semiconductor device according to claim 11, wherein the heat treatment in the course of raising temperature during start of the epitaxial growth process is effected at a holding temperature in the range of 700 to 1000° C.

16. A production method for a semiconductor device according to claim 12, wherein the heat treatment in the course of raising temperature during start of the epitaxial growth process is effected at a holding temperature in the range of 700 to 1000° C.

* * * * *